United States Patent [19]
Schubert

[11] Patent Number: 4,797,718
[45] Date of Patent: Jan. 10, 1989

[54] SELF-ALIGNED SILICON MOS DEVICE

[75] Inventor: Peter J. Schubert, Kokomo, Ind.

[73] Assignee: Delco Electronics Corporation, Kokomo, Ind.

[21] Appl. No.: 95,868

[22] Filed: Sep. 14, 1987

Related U.S. Application Data

[62] Division of Ser. No. 939,183, Dec. 8, 1986, Pat. No. 4,714,685.

[51] Int. Cl.$^4$ ............................................. H01L 29/78
[52] U.S. Cl. ................................... 357/23.4; 357/56; 357/59; 357/23.7; 357/23.9
[58] Field of Search ................. 357/56, 23.7, 23.9, 357/59 I, 59 G, 23.4

[56] References Cited

U.S. PATENT DOCUMENTS

| | | | |
|---|---|---|---|
| Re. 31,580 | 5/1984 | Kooi | 357/23 |
| 3,544,858 | 12/1970 | Kooi | 317/235 |
| 3,958,040 | 5/1976 | Webb | 427/94 |
| 4,178,197 | 12/1979 | Marinace | 148/175 |
| 4,333,965 | 6/1982 | Chow et al. | 427/93 |
| 4,384,301 | 5/1983 | Tasch, Jr. et al. | 357/23 |
| 4,428,111 | 1/1984 | Swartz | 357/56 X |
| 4,522,682 | 6/1985 | Soclof | 156/647 |
| 4,533,431 | 8/1985 | Dargent | 156/643 |

FOREIGN PATENT DOCUMENTS 0042552  12/1981  European Pat. Off. .

Primary Examiner—Andrew J. James
Assistant Examiner—William A. Mintel
Attorney, Agent, or Firm—Domenica N. S. Hartman

[57] ABSTRACT

An MOS transistor having relatively low parasitic capacitances is achieved by forming a dielectrically isolated mesa on a monocrystalline substrate. Such mesa includes a polycrystalline silicon region that serves as a gate region and an oxide layer that serves as a gate oxide. Subsequently, such mesa is made to sit on a platform, arising from the silicon substrate and surrounded by a sea of silicon dioxide originally at the level of the bottom of the mesa. The level of this sea is lowered to expose opposed sides of the platform to which is grown separate regions of lateral epitaxial silicon that serve as the source and drain of the transistor.

1 Claim, 3 Drawing Sheets

SELF-ALIGNED SILICON MOS DEVICE

This is a division of application Ser. No. 939,183 filed on Dec. 8, 1986 now U.S. Pat. No. 4,714,685 issued 12-22-87.

FIELD OF THE INVENTION

This invention relates to the fabrication of silicon MOS transistors which have relatively low parasitic capacitance and relatively low punchthrough current.

CROSS REFERENCE

This application is related to three other applications U.S. Ser. No. 940,436, filed Dec. 11, 1986, entitled "Semiconductor Mushroom Structure Fabrication"; U.S. Pat. No. 4,716,128, issued Dec. 29, 1987, entitled "Method of Refabricating Silicon-On-Insulator Like Devices"; and U.S. Ser. No. 939,078, filed Dec. 8, 1986, entitled "Double Self-Aligned Hole-Within-A-Hole Structure in Semiconductor Fabrication"; U.S. Pat. No. 4,714,685, issued Dec. 22, 1987. which were filed concurrently with the present application and in which there is one common inventor and a common assignee.

BACKGROUOND OF THE INVENTION

The importance of keeping parasitic capacitances low in insulated gate field effect transistors (IGFETs) has long been recognized and the industry has expended considerable effort in developing fabrication processes which result in transistors with low values of parasitic capacitances.

There are two major possible sources of parasitic capacitances in an IGFET. One is the overlap of the gate electrode over the edges of the source and drain regions. This overlap typically is controlled by processes which use the gate region (electrode) as the implantation mask for controlling the critical edge of the ion-implanted regions formed for the source and drain. Such processes are generally described as self-aligned processes.

The other possible major source of parasitic capacitance is associated with the interface or junction between the localized source and drain regions and the silicon substrate in which they are formed. To control this source, it is known to form the source and drain regions in a semiconductive layer which has been formed on an insulating substrate. Such silicon-on-insulator structures tend to be expensive to make and to have operating problems, such as kink-effects, and so have had limited acceptance. Alternatives to such a structure include structures in which buried dielectric regions of either silicon oxide or silicon nitride extend partially around the source and drain regions to limit the parasitic capacitance of such regions. These fabrication processes also tend to be complex, particularly if adapted to utilize self-aligned source and drain regions.

One example of a silicon-on-insulator like transistor is the "mushroom" shaped field effect transistor shown in Euopean Patent No. 42,552 to Hatano, entitled "MOS Device". The "mushroom" shape is essentially a relatively narrow "stem" of silicon grown through an oxide layer and having a silicon "head," of larger lateral dimension than the "stem", grown on top of the oxide layer. When the "mushroom" shape is formed by growing silicon, first vertically and then laterally over a step in an oxide layer, the silicon grown over the step has a tendancy to become polycrystalline. Field effect transistors having polycrystalline channel regions typically have poorer performance than those with monocrystalline (single crystal) silicon channel regions. The field effect transistors can be IGFETs or junction field effect transistors (J-FETs).

Another factor that is important in the manufacture of IGFETs is the isolation technique used to separate the individual transistors in an integrated circuit. For efficient manufacture, it is important that the fabrication technique used to limit parasitic capacitances be compatible with efficient isolation of this kind. A process which has recently been developed for efficient isolation uses sidewall-masked isolation (SWAMI) of which one variant forms individual islands each having sloped sidewalls. Thereafter standard technology is employed to form individual transistors completely in each island. However, in such processes no particular effort has been made to use buried insulating regions to enclose the source and drain to reduce their interface parasitic capacitances.

It would be desirable to have an economically viable process for producing a silicon-on-insulator like transistor structure which has a relatively low drain and source to semiconductor body (substrate) capacitance and has an essentially monocrystalline silicon channel region that provides the performance of conventional transistor structures.

SUMMARY OF INVENTION

In one illustrative embodiment, the present invention is directed to a process (method) which incorporates features of the self-aligned process, the buried insulating region process and the sloped sidewall masked isolation process to gain the advantages of each and to achieve a "mushroom" shape silicon-on-insulator like transistor having an essentially monocrystalline (single crystal) silicon channel region. In particular, the process of the invention involves the initial formation, for each transistor, of an individual mesa or island having vertical sidewalls. The mesa includes a polycrystalline silicon layer which is to serve as the gate region (electrode) and which is enclosed within a thin layer of silicon dioxide. A portion of the layer of silicon dioxide serves as the gate oxide. The mesa is supported on a doped monocrystalline silicon substrate and dielectrically isolated therefrom by the portion of the thin silicon dioxide layer that is to serve as the gate oxide. The silicon substrate is then etched to form a platform or island of sloped sidewalls on the top of which sits the vertical sidewall mesa. Then a sea or layer of silicon dioxide is formed over the silicon substrate to a level that preferentially covers at least the sloped sidewalls of the silicon platform, up to the original level of the single crystal silicon surface. The layer of silicon dioxide is preferably then reduced in thickness, by selective etching. Lateral, epitaxial silicon regions are then grown selectively out of such exposed portions on the opposed sidewalls, the bottom surfaces of these regions resting on the silicon dioxide sea. Then using the mesa with its polycrystalline silicon layer and oxide-covered vertical sidewalls as a mask, the two lateral epitaxial regions are doped, typically by ion implantation, to adapt them for use as the source and drain regions of the individual transistor. The channel is formed by the layer of the monocrystalline silicon platform which is intermediate between the source and drain regions.

As a consequence of this process, there is formed an array of individually isolated transistors, each of which has self-aligned source and drain regions which have limited interfaces with the monocrystalline silicon substrate in which is the channel of the transistor. In addition, the gate region of each transistor is self-aligned to its channel region. Conventional techniques are thereafter used to provide electrical connections to the source, drain and gate regions for interconnection of the transistors in a desired integrated circuit.

In another illustrative embodiment, the present invention is directed to a silicon body that is essentially monocrystalline, and includes a lower portion, an upper portion which includes doped source and drain regions and the region between them which serves as the channel, and a necked middle portion encircled by a layer of oxide which is sandwiched between the lower portion and the doped regions of the upper portion. A gate region dielectrically isolated from the silicon body overlies the surface of the intermediate channel portion of the upper portion. The present invention will be better understood from the subsequent more detailed description of an illustrative embodiment taken in conjunction with the accompanying drawings.

BRIEF DESCRIPTION OF THE DRAWINGS

The invention will be described in connection with the drawing in which.

Thicknesses and dimensions of selected conformations are exaggerated in the figures to more easily recognize the more important characteristics of this invention. Background lines are omitted for the same reasons.

DETAILED DESCRIPTION OF THE INVENTION

Figure 1:
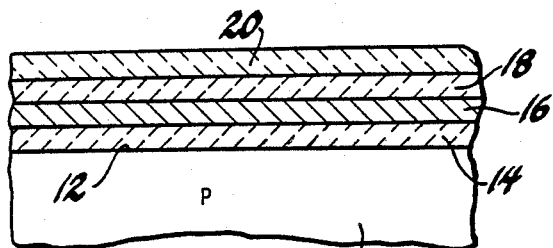
FIGS. 1–16 show in cross section the work piece at various stages of fabrication in accordance with one illustrative embodiment of the invention.

Referring now to FIG. 1, there is shown a semiconductor body 10 having a planar surface 12. Semiconductor body 10 is typically monocrystalline silicon of high resistivity and may be of p or n type conductivity having a dopant concentration of about $1 \times 10^{15}$ atoms per cubic centimeter. In the specific example being described, it will be assumed that the doping of body 10 is of p-type as is characteristic of the more widely used n-channel MOS transistor. Advantageously, the body is cut from a (100) single crystal so that the surface 12 corresponds to a (100) crystal plane. Typically, on planar surface 12 there will be formed hundreds or thousands of transistors simultaneously by the same series of steps but for convenience there will be illustrated the fabrication of only a single transistor.

A silicon dioxide gate layer 14 suitable for use as the gate oxide of the final transistor is thermally grown on top of surface 12. Layer 14 has deposited thereover a layer 16 of polysilicon (polycystalline silicon) which advantageously is doped with impurities suitable for adapting it for its role of gate region (electrode) of the transistor. Then the structure is treated so that layer 16 will be covered by a thin layer of silicon dioxide 18. A relatively thick layer of silicon nitride 20 is then deposited over layer 18. In a typical example, the silicon substrate is p-type doped to a concentration of about $1 \times 10^{15}$ acceptor atoms per cubic centimeter, silicon oxide layer 14 is about 500 Angstroms thick, polycrystalline silicon layer 16 is about 0.3 micron thick, the silicon dioxide layer 18 is about 250 Angstroms thick, and silicon nitride layer 20 is about 0.4 micron thick. Conventional technology can be used for forming these layers.

Figure 2:
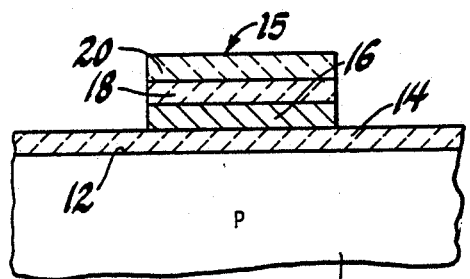
Figure 3:
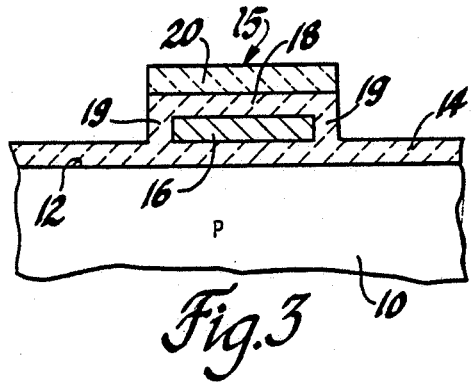
Figure 4:
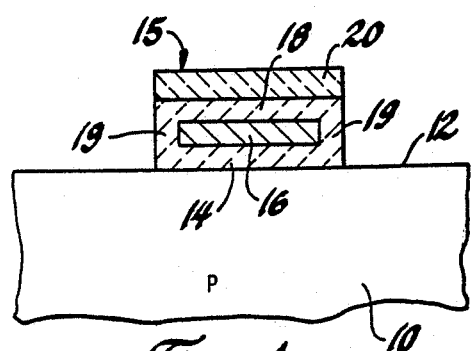

Using standard photolithographic techniques, the structure of FIG. 1 is then masked and etched such that only a central portion of layers 20, 18, and 16 remain over layer 14 and form a mesa 15 with substantially vertical sidewalls as is shown in FIG. 2. Mesa 15 is typically between 0.5 and 3.0 microns wide depending on the length of the channel between source and drain regions desired for each transistor. The exposed sidewalls of polysilicon layer 16 are then oxidized to a thickness of about 250 Angstroms such that polysilicon layer 16 is now surrounded by a silicon dioxide layer 19 as seen in FIG. 3. The structure is now subjected to an anisotropic etch which removes the oxide from surface 12 except where protected because silicon nitride layer 20 acts as a shadow mask. The resulting structure is shown in FIG. 4.

Next the silicon below surface 12 which is not protected by the mesa 15 is preferentially etched along a crystal plane using a preferential silicon etchant which results in the island-like structure shown in FIG. 5 in which the mesa 15 sits on a platform 25 of monocrystalline silicon having opposed sloped surfaces 12a and 12b between flat surfaces 12a. Techniques are known for such etching. Typically, the platform will be between 0.5 and 1.5 microns high and the sloped sidewalls will form 56.4 degree angles with the vertical.

Figure 5:
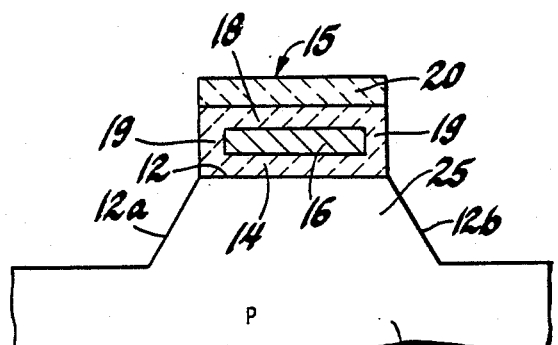
Figure 17:
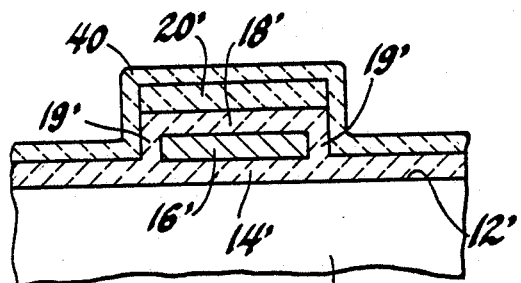
FIGS. 17–19 show in cross section particular stages of fabrication illustrating an alternative technique to go from the structure shown in FIG. 3 to the structure shown in FIG. 5.
Figure 18:
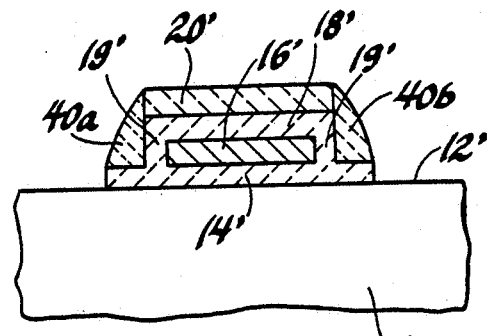
Figure 19:
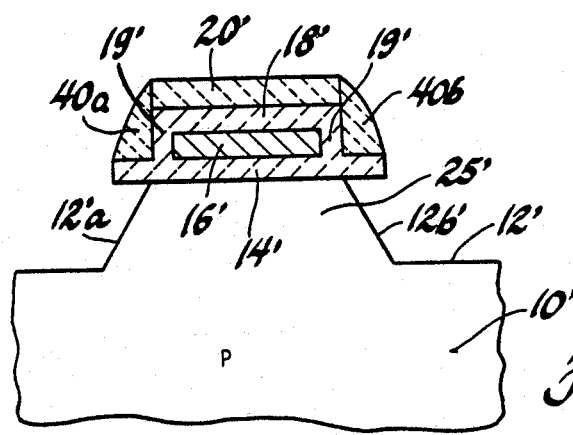

An alternative method to go from the structure having mesa 15, as shown in FIG. 3, to the structure shown in FIG. 5 is illustrated by FIGS. 17–19.

In particular, in the method shown in FIGS. 17–19, the semiconductor body 10' has its top surface 12' covered with a conformal layer 40 of deposited silicon oxide. This structure is then subjected to an anisotropic etch of known type to etch most of layer 40 away, leaving only the spacer portions 40a and 40b, as seen in FIG. 18, along the sidewalls of the mesa.

Thereafter, the resulting structure can be subjected to a preferential silicon etch, as was described previously to form the platform 25' with opposed sloped sidewalls 12a' and 12b' as depicted in FIG. 19.

Then an anistropic oxide etch can be used to remove the spacers 40a and 40b to achieve the structure shown in FIG. 5.

Figure 6:
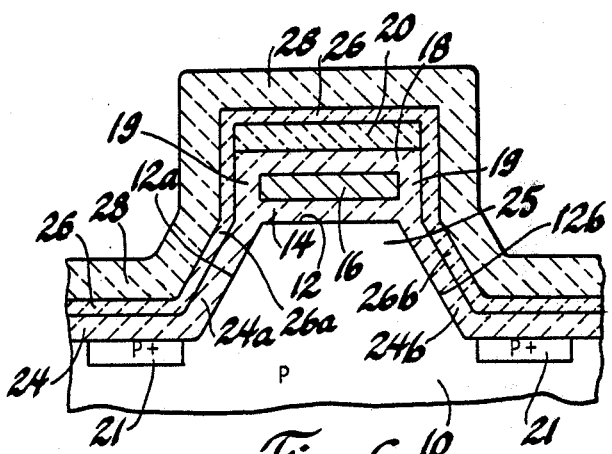

The structure is then treated to form a silicon dioxide layer 24 about 400 Angstroms thick along all exposed silicon surfaces. The silicon dioxide sidewalls on the sides of layer 19 thicken somewhat. An ion implant of p-type impurities, for example boron, is selectively done so as to heavily dope (to approximately $1 \times 10^{18}$ to $1 \times 10^{19}$ atoms per cubic centimeter) the portions 21 of body 10, to increase the electrical isolation between transistors by preventing inversion of such portions as is known in the art. This is typically denoted as a field or channel stop implant. The structure is then conformally coated with a relatively thin second layer of silicon nitride 26 of between 1000 and 1500 Angstroms which, in turn, is conformally coated with a layer of deposited silicon dioxide 28 of between 0.3 and 0.5 microns. The resulting structure is shown in FIG. 6.

Figure 7:
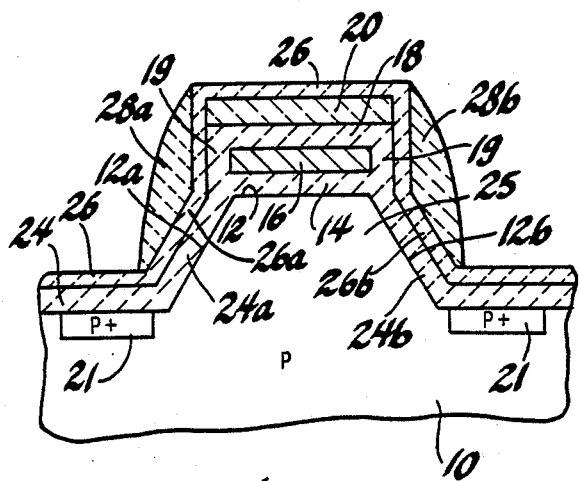
Figure 8:
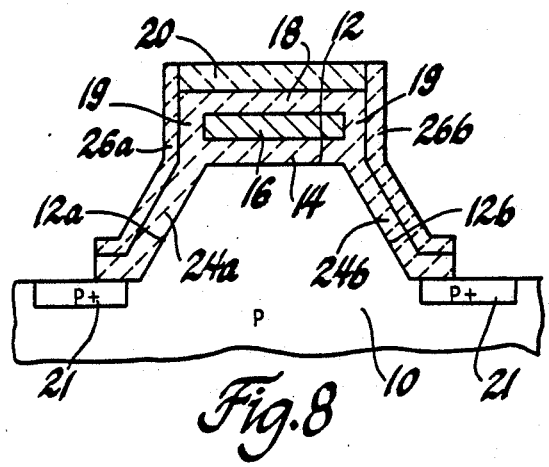

The silicon dioxide layer 28 is then anisotropically etched in the vertical direction with the result that essentially all of layer 28, except those portions 28a and 28b covering the sidewalls of the island portion 25 of the structure, is etched away, leaving the structure shown in FIG. 7. This structure is then subjected to a silicon nitride etch which etches away the second layer of silicon nitride 26 except for those portions 26a and 26b protected by the silicon dioxide 28. The residual silicon dioxide portions 28a and 28b are then removed, which concurrently removes the exposed portions of silicon oxide layer 24. The remaining portions 26a and 26b protect side portions 24a and 24b of the silicon oxide layer 24. The resulting structure is shown in FIG. 8. Due to the relative greater thickness of the first nitride layer 20 on top of the mesa, its thickness will not be significantly decreased when the second nitride layer 26a and 26b is removed. When the second nitride layer 26a and 26b is etched, it is slightly overetched, typically, which is one reason why the first nitride layer 20 is made relatively thick.

Figure 9:
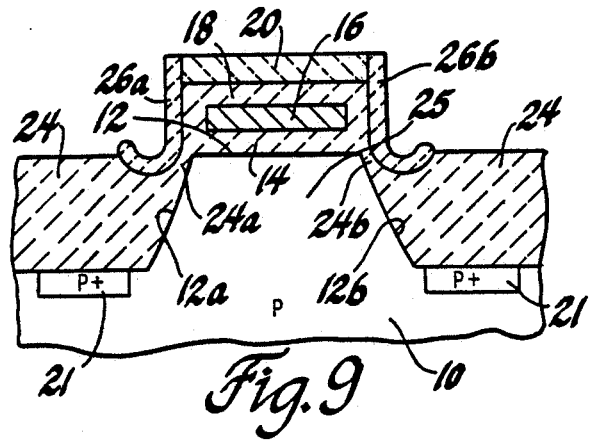

This structure is now subjected to an oxidizing anneal which causes silicon dioxide 24 to grow first at the lower edges near surface 12a and 12b which causes the edges of silicon nitride layer 26 to curl up, exposing more of the underlying residual silicon dioxide portions 24a and 24b at such edges and this exposed silicon dioxide increases in thickness. This causes the sides of nitride layer 26a and 26b to rise further until the structure shown in FIG. 9 is achieved, in which the platform portion 25 of the monocrystalline silicon 10 is substantially surrounded by a sea of silicon dioxide 24 which is at the level of the mesa.

This structure is then subjected to an etch which selectively removes the remains of silicon nitride layer 26a and 26b. The structure is then subjected to an anisotropic silicon dioxide etch which lowers the sea of silicon dioxide 24 and exposes a portion of surfaces 12a and 12b of the platform 25. The amount of surface exposed will determine the size of the source and drain regions and so is chosen appropriately, as will hereinafter become apparent. Typically, a doping depth will be between 300 Angstroms and 1.3 microns, to provide source and drain regions between 0.5 and 1.5 microns deep. The structure resulting from these two steps is shown in FIG. 10.

Figure 10:
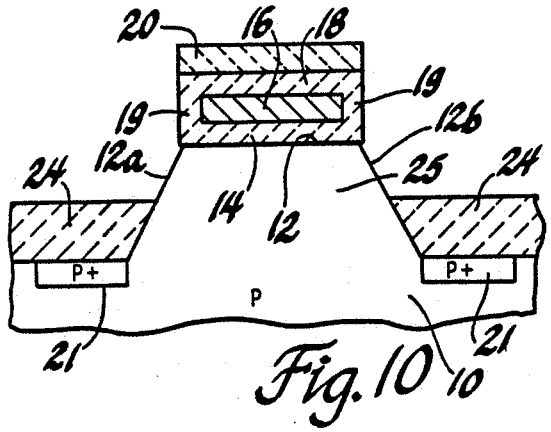
Figure 11:
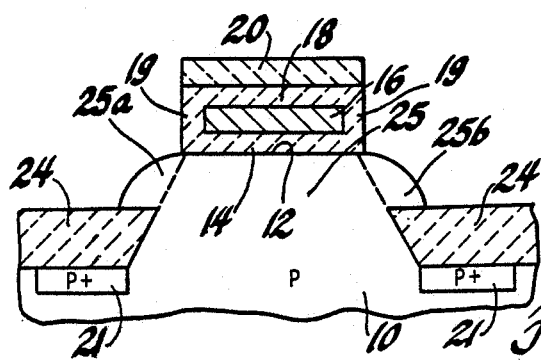

Next the structure of FIG. 10 is placed in an epitaxial reactor where the gases and temperature are selected such that deposited silicon atoms adhere firmly to the exposed portions of platform 25 and form a high resistivity lateral epitaxial region, but do not adhere firmly to silicon dioxide or silicon nitride surfaces so that any silicon deposited can be readily removed from such surfaces. This step is commonly referred to as selective or lateral epitaxial deposition of silicon, or selective epitaxy. If necessary, the crystallinity of such regions can be increased by suitable heat treating, as for example, laser annealing, as is known in the art. The net result of this step is that the sides of the platform 25 extend laterally as in FIG. 11 to form high resistivity single crystal silicon regions 25a and 25b. Since these regions will serve as IGFET source and drain regions, they must be convertible to n-type conductivity.

Figure 12:
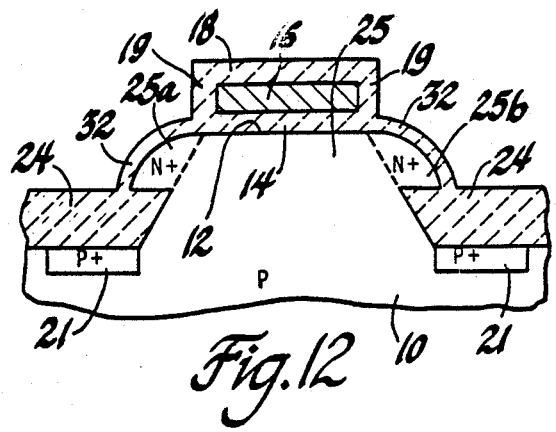

As shown in FIG. 12, silicon nitride layer 20 remaining on the mesa is now removed by etching and a silicon dioxide layer 32 is thermally grown such that regions 25a and 25b are encapsulated by insulating silicon dioxide except for the one face contiguous to the original platform portion 25. This original platform portion 25 is intermediate between regions 25a and 25b and essentially serves as the channel portion of the insulated gate field effect transistor (IGFET) that is to be formed in these portions of semiconductor body 10. This structure is then subject to a blanket ion implantation of n-type donor ions of sufficient dosage to increase the conductivity of regions 25a and 25b which will serve as an n-type source region and an n-type drain region, respectively, of the transistor. If the ends of platform portion 25 that are perpendicular to the plane of the paper showing the FIGS. are not embedded in a surrounding field oxide, they will have to be masked with photoresists during this implantation. Gate region 16 is an n-type conductivity region. The dopant concentration of all of regions 16, 25a and 25b is approximately $1 \times 10^{18}$ to $1 \times 10^{20}$ atoms per cubic centimeter. The resulting structure, which includes all the basic elements of an IGFET, is shown in FIG. 12.

There remains to provide desired electrical connections to the source, drain and gate regions to permit connection of the transistor into an integrated circuit.

Figure 13:
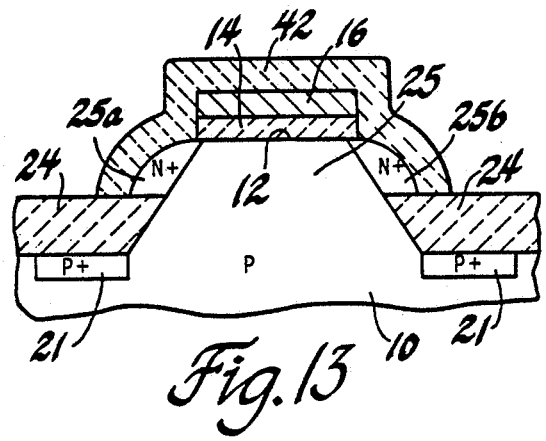

A variety of techniques are available for this purpose. A preferred technique involves initially removing the thin thermally grown oxide layer 32 which remains over the top surface of the structure and then depositing a relatively thick conformal layer 42 of silicon dioxide by chemical vapor deposition over the entire top surface of the structure, as is shown in FIG. 13. However, oxide layer 32 need not be removed.

Figure 14:
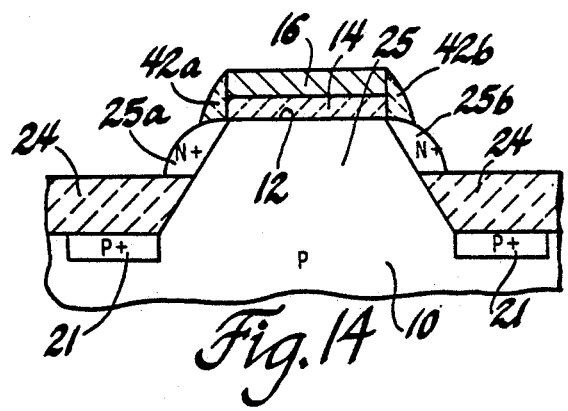

Then an anisotropic oxide etch leaves in place of the conformal layer 42 only spacer portions 42a and 42b which are positioned along the sidewalls of the polycrystalline electrode (gate region) 16 and their junctions with the regions 25a and 25b as shown in FIG. 14.

Figure 15:
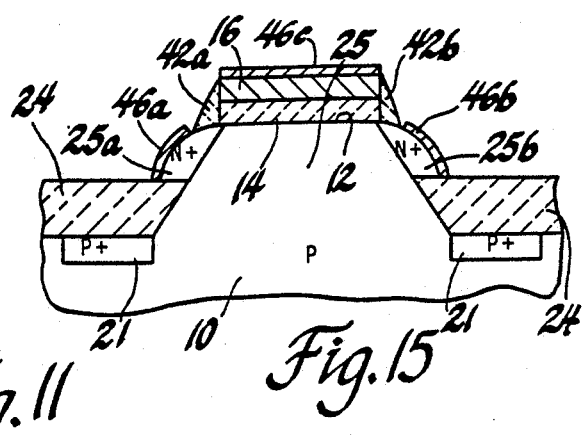

The resultant is then covered with a refractory metal, typically tungsten, titanium or tantalum, and then subjected to a rapid thermal anneal to convert the metal in contact with the silicon to a silicide layer but to leave unreacted the metal over the sidewall spacers 42a and 42b. This anneal also can serve to activate the ions earlier implanted into regions 25a and 25b. The unreacted metal can then be easily removed by a selective etch which little affects the silicide. The resultant is shown in FIG. 15 where a first part of the silicide layer 46c covers the top of the polycrystalline gate region (electrode) 16, a second part of the silicide layer 46a covers surface portions of region 30a, and a third part of the silicide layer 46b covers surface portions of region 30b.

Figure 16:
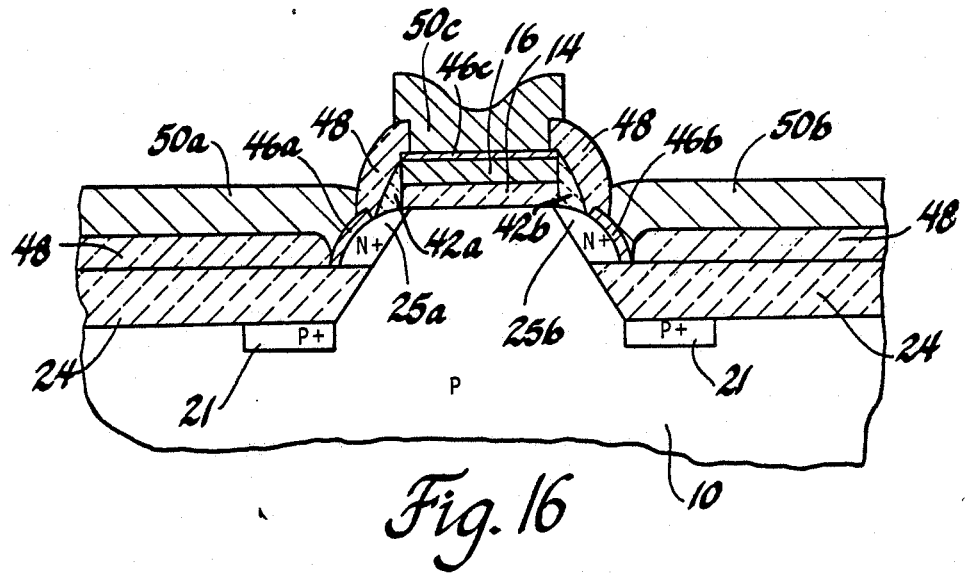

Then a phosphorus-rich glass layer 48 is deposited over the top surface of the structure and contact openings are formed in it wherever electrical contact is to be made to the transistor, i.e., the source, drain and gate regions. Standard techniques are available for this purpose. Then a blanket layer of the contact metal, typically an aluminum-silicon alloy, is deposited over the glass to fill the contact openings and this layer is patterned to provide the desired interconnection pattern to provide the desired interconnection pattern between the transistors and any other devices (not shown) fabricated on or in body 10 as needed for an integrated circuit. This is shown in FIG. 16 where the glass layer 48 is shown provided with openings filled with the aluminum-silicon alloy to contact the portions 46a, 46b, and 46c of the silicide layer over the source 30a and drain 30b regions and the polycrystalline gate region (electrode) 16, respectively. The aluminum-silicon alloy contacts to silicide regions 46a, 46b, and 46c are shown as 50a, 50b, and 50c, respectivcely. In some instances, two or more levels of metalization may be needed.

The transistor of FIG. 16 is fully aligned with the drain 25a and source 25b regions being aligned to the gate region 16 and with the gate region 16 being aligned to the platform portion 25 of the body 10. This helps reduce overlap capacitance and drain to substrate and source to substrate capacitances. The transistor described and illustrated herein has an advantage over silicon-on-insulator devices of readily permitting backgate biasing which eliminates the "kink" effect.

Moreover, because it has source and drain regions which form limited-area p-n junctions with the monocrystalline substrate silicon, it has lower parasitic capacitances and lower leakage currents. These in turn make for higher switching speeds, reduced short channel effects, increased radiation hardening, increased resistance to p-n-p-n latch-up, and higher breakdown voltages.

The illustrated transistor can be described as follows. It comprises a silicon body that is essentially monocrystalline, and includes a lower portion, an upper portion which includes the doped source 25a and drain 25b regions and the region between them which serves as the channel, and a necked middle portion encircled by a layer of oxide which is sandwiched between the lower portion and the doped regions of the upper portion. A gate electrode dielectrically isolated from the silicon body overlies the surface of the intermediate channel portion of the upper portion.

It is to be appreciated that the specific embodiment described is merely illustrative of the general principle of the invention. While the invention has been described for the preparation of the more popular n-channel IGFETs, it can be readily adapted to the fabrication of p-channel IGFETs, CMOS integrated circuits, or other types of field effect transistors such junction field effect transistors (J-FETS) by suitable choice of the dopings used and appropiate processing. Moreover such dopings may be done at stages of the processing other than as described in the illustrative embodiment. Additionally, a variety of known techniques are available for each of the steps involved consistent with the invention. In addition it may prove feasible to substitute other materials for the silicon nitride and even for the silicon oxide to a limited extent. Still further, the semiconductor body can be gallium arsenide and ternary and quaternary compounds of III-V or II-VI compounds such as InGaAs and AlGaInP with the process being modified to be consistent with the processing requirements of these materials. For example, the structure could comprise GaAs grown on a CVD layer of $Si_xN_y$.

The embodiments of this invention in which an exclusive property or privilege is claimed are defined as follows:

1. An MOS transistor including a silicon body which includes an upper portion, a middle portion, and a lower portion, the upper portion including an intermediate channel portion and laterally grown epitaxial regions, the intermediate channel portion being of one conductivity type and located between the laterally grown epitaxial regions which are doped to be of an opposite conductivity type for serving as the respective source and drain regions of the transistor, the middle portion including a tapered portion which is contiguous with the intermediate channel portion, the tapered portion being encircled by a layer of silicon oxide which is sandwiched between the lower portion and the doped regions of the upper portion, the lower portion including an intermediate substrate portion and laterally disposed field implants, the intermediate substrate portion being contiguous with the tapered portion, the laterally disposed field implants being adjacent to the layer of silicon dioxide and being the same conductivity type as the intermediate substrate portion but more heavily doped than the intermediate substrate portion, the tapered portion included within the middle portion and the intermediate substrate portion included within the lower portion being of the one conductivity type, and a gate region dielectrically isolated from the silicon body and overlying the surface of the intermediate channel portion.

* * * * *